(12) United States Patent
Nirschl

(10) Patent No.: US 7,292,466 B2
(45) Date of Patent: Nov. 6, 2007

(54) INTEGRATED CIRCUIT HAVING A RESISTIVE MEMORY

(75) Inventor: Thomas Nirschl, Loiching (DE)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 11/324,700

(22) Filed: Jan. 3, 2006

(65) Prior Publication Data
US 2007/0153563 A1   Jul. 5, 2007

(51) Int. Cl.
*G11C 11/00* (2006.01)

(52) U.S. Cl. .................. 365/148; 365/158; 365/210

(58) Field of Classification Search ............ 365/148, 365/158, 163, 210, 185.21
See application file for complete search history.

(56) References Cited

U.S. PATENT DOCUMENTS

| | | | |
|---|---|---|---|
| 4,876,668 A * | 10/1989 | Thakoor et al. ............ | 365/163 |
| 6,075,719 A | 6/2000 | Lowrey et al. | |
| 6,222,771 B1 | 4/2001 | Tang et al. | |
| 6,687,153 B2 | 2/2004 | Lowrey | |
| 6,758,711 B2 | 7/2004 | Chen | |
| 6,813,177 B2 | 11/2004 | Lowrey et al. | |
| 6,847,544 B1 * | 1/2005 | Smith et al. ............... | 365/158 |
| 6,898,113 B2 * | 5/2005 | Tsuji ....................... | 365/158 |
| 2004/0246804 A1 | 12/2004 | Cho et al. | |
| 2004/0246808 A1 | 12/2004 | Cho et al. | |
| 2005/0117387 A1 | 6/2005 | Hwang et al. | |
| 2005/0117388 A1 | 6/2005 | Cho et al. | |
| 2005/0169093 A1 | 8/2005 | Choi et al. | |
| 2005/0281073 A1 * | 12/2005 | Cho et al. ................. | 365/148 |

OTHER PUBLICATIONS

Greg Artwood et al., "Intel StrataFlash™ Memory Technology Overview", Intel Technology Journal Q4'97, pp. 1-8.
Tyler Lowrey, "Ovonic Unified Memory", Ovonyx, Inc., Slides 1-80 (Dec. 1999).
T. Sakamoto et al., "A Nonvolatile Programmable Solid Electrolyte Nanometer Switch", 2004 IEEE International Solid-State Circuits Conference.
Hyung-rok Oh et al., "Enhanced Write Performance of a 64Mb Phase-change Random Access Memory", 2005 International Solid-State Circuits Conference.

* cited by examiner

*Primary Examiner*—Gene N Auduong
(74) *Attorney, Agent, or Firm*—Dicke, Billig & Czaja, PLLC

(57) ABSTRACT

A memory includes a first resistive memory cell, a current source configured to provide an input current indicating a desired resistance level for the first memory cell, and a current mirror that mirrors the input current to provide an output current. The memory includes a first switching circuit configured to pass the output current to the first memory cell with the first memory cell not at the desired resistance level, and block the output current from the first memory cell in response to the first memory cell achieving the desired resistance level.

24 Claims, 4 Drawing Sheets

INTEGRATED CIRCUIT HAVING A RESISTIVE MEMORY

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase-change memory. Phase-change memory uses a phase-change material for the resistive memory element.

Phase-change memories are based on phase-change materials that exhibit at least two different states. Phase-change material may be used in memory cells to store bits of data. The states of phase-change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase-change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase-change materials may be induced reversibly. In this way, the memory may change from the amorphous state to the crystalline state and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. In any of these methods, controllable heating of the phase-change material causes controllable phase change within the phase-change material.

A phase-change memory including a memory array having a plurality of memory cells that are made of phase-change material may be programmed to store data utilizing the memory states of the phase-change material. One way to read and write data in such a phase-change memory device is to control a current and/or a voltage pulse that is applied to the phase-change material. The level of current and/or voltage generally corresponds to the temperature induced within the phase-change material in each memory cell.

To achieve higher density phase-change memories, a phase-change memory cell can store multiple bits of data. Multi-bit storage in a phase-change memory cell can be achieved by programming the phase-change material to have intermediate resistance values or states. If the phase-change memory cell is programmed to one of three different resistance levels, 1.5 bits of data per cell can be stored. If the phase-change memory cell is programmed to one of four different resistance levels, two bits of data per cell can be stored, and so on. For simplicity, the description in this disclosure is substantially focused on four different resistance levels or states and two bits of data per cell. This is for illustrative purposes only, however, and not intended to limit the scope of the invention. In principle it is possible to store three or more states. To program a phase-change memory cell to an intermediate resistance value, the amount of crystalline material coexisting with amorphous material and hence the cell resistance is controlled via a suitable write strategy.

SUMMARY

One embodiment of the present invention provides a memory. The memory includes a first resistive memory cell, a current source configured to provide an input current indicating a desired resistance level for the first memory cell, and a current mirror that mirrors the input current to provide an output current. The memory includes a first switching circuit configured to pass the output current to the first memory cell with the first memory cell not at the desired resistance level, and block the output current from the first memory cell in response to the first memory cell achieving the desired resistance level.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
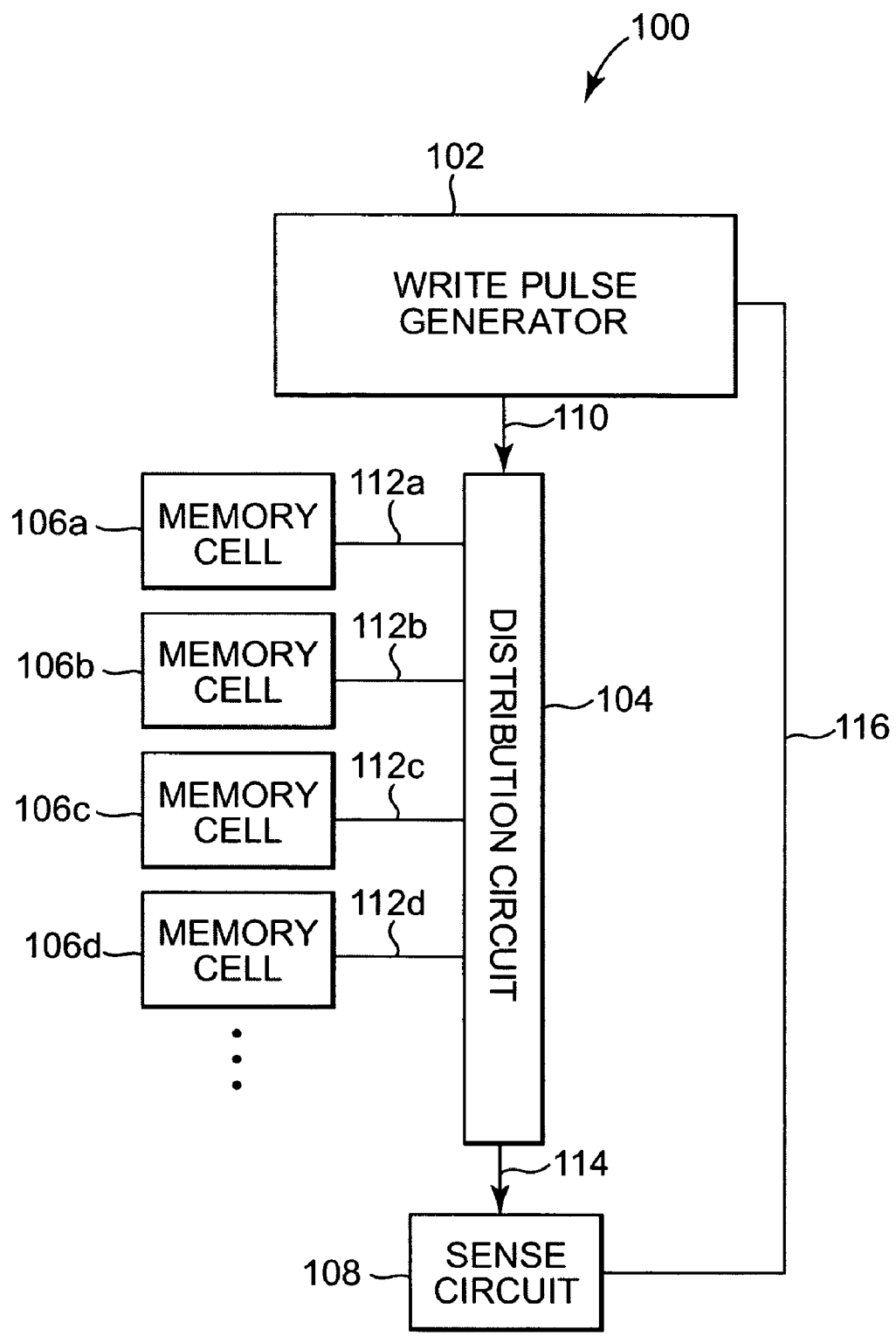
FIG. 1 is a block diagram illustrating one embodiment of a memory device.

FIG. 1 is a block diagram illustrating one embodiment of a memory device 100. Memory device 100 includes a write pulse generator 102, a distribution circuit 104, memory cells 106a, 106b, 106c, and 106d, and a sense circuit 108. Each of the memory cells 106a-106d is a phase-change memory cell that stores data based on the amorphous and crystalline states of phase-change material in the memory cell. Also, each of the memory cells 106a-106d can be programmed into more than two states by programming the phase-change material to have intermediate resistance values. To program one of the memory cells 106a-106d to an intermediate resistance value, the amount of crystalline material coexisting with amorphous material—and hence the cell resistance—is controlled via a suitable write strategy.

A phase-change memory cell 106a-106d is programmed into one of the more than two resistance levels by first resetting the phase-change memory cell to the substantially amorphous state. Next, a constant current pulse is applied to the phase-change memory cell. The current pulse remains applied to the phase-change memory cell to set the phase-change memory cell to a selected one of the more than two resistance levels. The phase-change memory cell is set to the selected on of the more than two resistance levels by monitoring the state of the memory cell and removing the constant current pulse once the selected one of the resistance levels has been obtained.

Write pulse generator 102 provides pulses to memory cells 106a- 106d and programs one of the more than two resistance levels or states into the phase-change material of each of the memory cells 106a-106d. Sense circuit 108 senses the state of the phase-change material and provides signals that indicate the state of the phase-change material in a memory cell.

Write pulse generator 102 is electrically coupled to distribution circuit 104 through signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. In addition, distribution circuit 104 is electrically coupled to sense circuit 108 through signal path 114, and sense circuit 108 is electrically coupled to write pulse generator 102 through signal path 116.

Each of the memory cells 106a-106d includes a phase-change material that may be changed from an amorphous state to a crystalline state or from a crystalline state to an amorphous state under the influence of temperature change. The amount of crystalline material coexisting with amorphous material in the phase-change material of one of the memory cells 106a-106d thereby defines more than two states for storing data within memory device 100. In the amorphous state, a phase-change material exhibits significantly higher resistivity than in the crystalline state. Therefore, the more than two states of memory cells 106a-106d differ in their electrical resistivity. In one embodiment, the more than two states can be three states and a trinary system can be used, wherein the three states are assigned bit values of "0", "1", and "2". In one embodiment, the more than two states are four states that can be assigned multi-bit values, such as "00", "01", "10", and "11". In other embodiments, the more than two states can be any suitable number of states in the phase-change material of a memory cell.

In one embodiment, write pulse generator 102 provides voltage pulses to distribution circuit 104 through signal path 110 and distribution circuit 104 controllably directs the voltage pulses to memory cells 106a-106d through signal paths 112a-112d. In one embodiment, distribution circuit 104 includes a plurality of transistors that controllably direct voltage pulses to each of the memory cells 106a-106d. In other embodiments, write pulse generator 102 provides current pulses to distribution circuit 104 through signal path 110 and distribution circuit 104 controllably directs the current pulses to memory cells 106a-106d through signal paths 112a-112d.

Sense circuit 108 reads each of the more than two states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In one embodiment, sense circuit 108 provides voltage across one of the memory cells 106a-106d and reads the current that flows through that one of the memory cells 106a-106d. In one embodiment, write pulse generator 102 provides voltage across one of the memory cells 106a-106d and sense circuit 108 reads the current that flows through that one of the memory cells 106a-106d. In one embodiment, write pulse generator 102 provides current through one of the memory cells 106a-106d and sense circuit 108 reads the voltage across that one of the memory cells 106a-106d.

In operation of one embodiment, write pulse generator 102 resets the phase-change material in memory cells 106a-106d. A reset operation includes heating the phase-change material of the target memory cell above its melting temperature and quickly cooling the phase-change material to thereby achieve a substantially amorphous state. This amorphous state is one of the more than two states of each of the memory cells 106a-106d and is the highest resistance state.

Write pulse generator 102 is configured to provide a pulse to program a selected one of the more than two states into a selected one of the memory cells 106a-106d. Write pulse generator 102 provides a pulse to the selected one of the memory cells 106a-106d to crystallize part of the phase-change material and thereby lower the resistance of the selected one of the memory cells 106a-106d.

Figure 2:
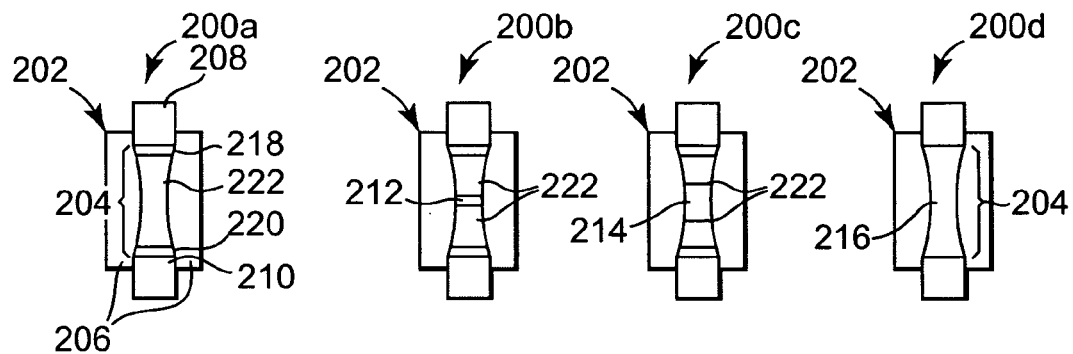
FIG. 2 is a diagram illustrating one embodiment of a memory cell in four different states.

FIG. 2 is a diagram illustrating one embodiment of a memory cell 202 in four different states at 200a, 200b, 200c, and 200d. Memory cell 202 includes a phase-change material 204 that is situated in insulation material 206. Phase-change material 204 is an elongated strip of material that is thinner in the middle and wider at the ends. Insulation material 206 is rectangular shaped. In other embodiments, memory cell 202 can have any suitable geometry including phase-change material 204 in any suitable geometry and insulation material 206 in any suitable geometry.

Phase-change material 204 is electrically coupled at one end to a first electrode 208 and at the other end to a second electrode 210. Pulses are provided to memory cell 202 via first electrode 208 and second electrode 210. The current path through phase-change material 204 is from one of the first electrode 208 and second electrode 210 to the other one of the first electrode 208 and second electrode 210. In one embodiment, each of the memory cells 106a-106d is similar to memory cell 202.

Memory cell 202 provides a storage location for storing bits of data. Insulation material 206 can be any suitable insulator, such as $SiO_2$, fluorinated silica glass (FSG), or doped boro-phosphorous silicate glass (BPSG). First electrode 208 and second electrode 210 can be any suitable electrode material, such as TiN, TaN, W, Al, or Cu.

Phase-change material 204 may be made up of a variety of materials in accordance with the present invention. Generally, chalcogenide alloys that contain one or more elements from group VI of the periodic table are useful as such materials. In one embodiment, phase-change material 204 of memory cell 202 is made up of a chalcogenide compound material, such as GeSbTe, SbTe, GeTe, or AgInSbTe. In another embodiment, the phase-change material can be chalcogen free, such as GeSb, GaSb, InSb, or GeGaInSb. In other embodiments, the phase-change material can be made up of any suitable material including one or more of the elements Ge, Sb, Te, Ga, As, In, Se, and S.

Phase-change material 204 is programmed into one of four states to store two bits of data. A selection device, such as an active device like a transistor or diode, is coupled to first electrode 208 to control the application of pulses to phase-change material 204. The pulses reset phase-change material 204 and program one of the other three states into phase-change material 204. At 200b, a small middle region 212 of phase-change material 204 has been programmed to change the resistance through phase-change material 204 and memory cell 202. At 200c, a medium sized middle region 214 of phase-change material 204 has been programmed to change the resistance through phase-change material 204 and memory cell 202. At 200d, a large middle region 216, which is substantially all of phase-change material 204, has been programmed to change the resistance through phase-change material 204 and memory cell 202. The size of the programmed middle region is related to the resistance through phase-change material 204 and memory cell 202. The three different sized middle region states at 200b-200d plus the initial state at 200a provide four states in phase-change material 204, and memory cell 202 provides a storage location for storing two bits of data. In one embodiment, the state of memory cell 202 at 200a is a "00", the state of memory cell 202 at 200b is a "01", the state of memory cell 202 at 200c is a "10", and the state of memory cell 202 at 200d is a "11".

At 200a, phase-change material 204 is reset to a substantially amorphous state. During a reset operation of memory cell 202, a reset pulse is selectively enabled by the selection device and sent through first electrode 208 and phase-change material 204. The reset pulse heats phase-change material 204 above its melting temperature and phase-change material 204 is quickly cooled to achieve the substantially amorphous state at 200a. After a reset operation, phase-change material 204 includes crystalline state phase-change material at 218 and 220, and amorphous state phase-change material at 204. The substantially amorphous state at 200a is the highest resistance state of memory cell 202.

To program phase-change material 204 into one of the other three states 200b-200d, a pulse is provided via a write pulse generator, such as write pulse generator 102. At 200b, a pulse is provided to program the small middle region at 212 into a crystalline state. The crystalline state is less resistive than the amorphous state and memory cell 202 at 200b has a lower resistance than memory cell 202 in the substantially amorphous state at 200a. At 200c, a pulse is provided to program the middle region at 214 into a crystalline state. Since the middle region at 214 is larger than the small middle region at 212 and the crystalline state is less resistive than the amorphous state, memory cell 202 at 200c has a lower resistance than memory cell 202 at 200b and memory cell 202 in the amorphous state at 200a. At 200d, a pulse is provided to program the large middle region at 216 into the crystalline state. Since the large middle region at 216 is larger than the middle region at 214 and the crystalline state is less resistive than the amorphous state, memory cell 202 at 200d has a lower resistance than memory cell 202 at 200c, memory cell 202 at 200b, and memory cell 202 in the amorphous state at 200a. Memory cell 202 at 200d is in the lowest resistance state. In other embodiments, memory cell 202 can be programmed into any suitable number of resistance values or states.

As used herein the term "electrically coupled" is not meant to mean that the elements must be directly coupled together and intervening elements may be provided between the "electrically coupled" elements.

Figure 3A:
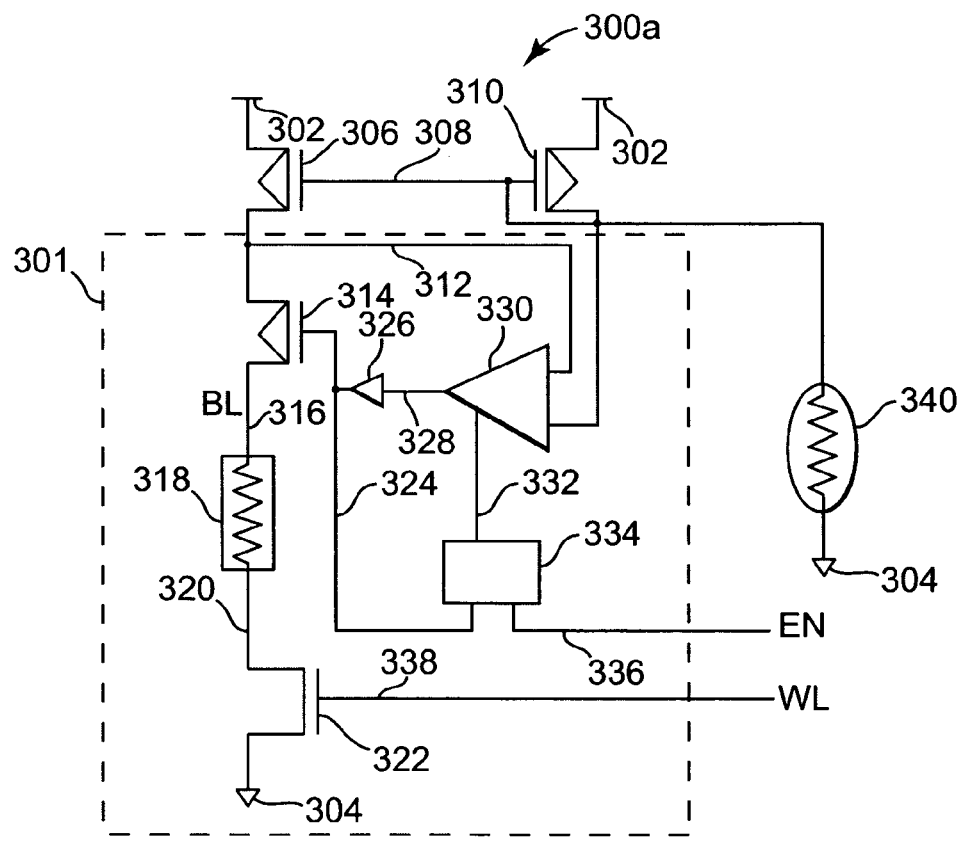
FIG. 3A is a diagram illustrating one embodiment of a circuit for programming a phase-change memory cell.

FIG. 3A is a diagram illustrating one embodiment of a circuit 300a for programming a phase-change memory cell. In one embodiment, circuit 300a includes a portion of write pulse generator 102 and distribution circuit 104 for programming phase-change memory cells into any one of the four states illustrated in FIG. 2. Circuit 300a includes a switching and memory cell circuit indicated at 301. Circuit 300a also includes a current source 340 and a current mirror formed by transistors 306 and 310. Switching and memory cell circuit 301 includes transistors 314 and 322, a phase-change memory cell 318, a buffer 326, a sense amplifier 330, and a logic block 334.

One side of the source-drain path of transistor 306 is electrically coupled to a voltage source 302, and the other side of the source-drain path of transistor 306 is electrically coupled to a first input of sense amplifier 330 and one side of the source-drain path of transistor 314 through signal path 312. The gate of transistor 306 is electrically coupled to the gate of transistor 310, one side of the source-drain path of transistor 310, a second input of sense amplifier 330, and one side of current source 340 through signal path 308. The other side of the source-drain path of transistor 310 is electrically coupled to voltage source 302. The other side of current source 340 is electrically coupled to common or ground 304.

The output of sense amplifier 330 is electrically coupled to the input of buffer 326 through signal path 328. The output of buffer 326 is electrically coupled to the gate of transistor 314 and a first input of logic block 334 through signal path 324. A second input of logic block 334 receives an enable (EN) signal on EN signal path 336. The output of logic block 334 is electrically coupled to the enable input of sense amplifier 330 through control signal path 332.

The other side of the drain-source path of transistor 314 is electrically coupled to one side of phase-change memory cell 318 through bit line (BL) 316. The other side of phase-change memory cell 318 is electrically coupled to one side of the source-drain path of transistor 322 through signal path 320. The other side of the source-drain path of transistor 322 is electrically coupled to common or ground 304. The gate of transistor 322 receives a word line (WL) signal on word line 338.

Current source 340 provides a variable current based on the desired state of phase-change memory cell 318. The setting of the current provided by current source 340 determines the state to which phase-change memory cell 318 will be set. In one embodiment, current source 340 includes a resistor and a voltage source. The voltage source and/or resistor are variable such that a desired current is provided on signal path 308. In another embodiment, current source 340 includes a current mirror for providing the desired current on signal path 308.

Transistors 306, 310, and 314 are p-channel metal-oxide-semiconductor (PMOS) transistors and transistor 322 is an n-channel MOS (NMOS) transistor. Transistors 306 and 310 form a current mirror. The input of the current mirror receives the current provided by current source 340 on signal path 308. The current on signal path 308 at the input to the current mirror is mirrored on signal path 312 at the output of the current mirror. Transistors 314 and 322 act as switches.

Logic block 334 receives the EN signal on EN signal path 336 and the signal on signal path 324 to provide a control signal on control signal path 332. In response to a logic high EN signal or a logic low signal on signal path 324, logic block 334 outputs a logic high signal on signal path 332. In response to a logic low EN signal or a logic high signal on signal path 324, logic block 334 outputs a logic low signal on signal path 332.

In response to a logic low signal on signal path 332, sense amplifier 330 is disabled. In response to a logic high signal on signal path 332, sense amplifier 330 is enabled to compare the voltage on signal path 308 at the input of the current mirror to the voltage on signal path 312 at the output of the current mirror. The voltage on signal path 308 at the input of the current mirror indicates the desired resistance for phase-change memory cell 318. The voltage on signal path 312 at the output of the current mirror indicates the actual resistance of phase-change memory cell 318. Sense amplifier 330 outputs a signal on signal path 328 based on the comparison. In response to the voltage on signal path 308 being less than the voltage on signal path 312, sense amplifier 330 outputs a logic low signal on signal path 328. In response to the voltage on signal path 308 being greater than or equal to the voltage on signal path 312, sense amplifier 330 outputs a logic high signal on signal path 328.

Buffer 326 receives the signal on signal path 328 to provide the signal on signal path 324. In response to a logic low signal on signal path 328, buffer 326 provides a logic low signal on signal path 324 to turn on transistor 314. With transistor 314 turned on, the signal on signal path 312 is passed to bit line 316. In response to a logic high signal on signal path 328, buffer 326 provides a logic high signal on signal path 324 to turn off transistor 314. With transistor 314 turned off, the signal on signal path 312 is blocked from passing to bit line 316.

In response to a logic high WL signal on word line 338, transistor 322 turns on to select phase-change memory cell 318. In response to a logic low WL signal on word line 338, transistor 322 turns off to deselect phase-change memory cell 318. With transistors 314 and 322 turned on, phase-change memory cell 318 receives the constant current on signal path 312 from the output of the current mirror. In response to the constant current, phase-change memory cell 318 transitions from the substantially amorphous state to a partially or substantially crystalline state. The voltage at the output of the current mirror on signal path 312 indicates the actual state of phase-change memory cell 318. The voltage on signal path 312 decreases in response to a decrease in the resistance of phase-change memory cell 318.

In operation, phase-change memory cell 318 is selected by providing a logic high WL signal on word line 338. If phase-change memory cell 318 is not in the substantially amorphous state, phase-change memory cell 318 receives a reset pulse on bit line 316 from a write pulse generator (not shown) to reset phase-change memory cell 318 to the substantially amorphous state. Current source 340 is adjusted to provide the current on signal path 308 based on the desired resistance level or state for phase-change memory cell 318.

With phase-change memory cell 318 selected and in the substantially amorphous state, a logic high EN signal on EN signal path 336 is provided to enable sense amplifier 330. Transistor 314 turns on to apply a current pulse to phase-change memory cell 318. The current pulse remains applied to phase-change memory cell 318 until phase-change memory cell 318 achieves the desired state based on the comparison of the voltage at the input of the current mirror to the voltage at the output of the current mirror. Once phase-change memory cell 318 is at the desired state, sense amplifier 330 provides the signal to turn off transistor 314. The signal from sense amplifier 330 also disables sense amplifier 330 through logic block 334 to conserve power.

Circuit 300a can also be used for reading phase-change memory cell 318. By the application of a reference current to the current mirror, sense amplifier 330 evaluates whether the resistance of phase-change memory cell 318 is greater than or less than the resistance of current source 340. The reference current is less than the write current to prevent corruption of the data stored in phase-change memory cell 318.

Figure 3B:
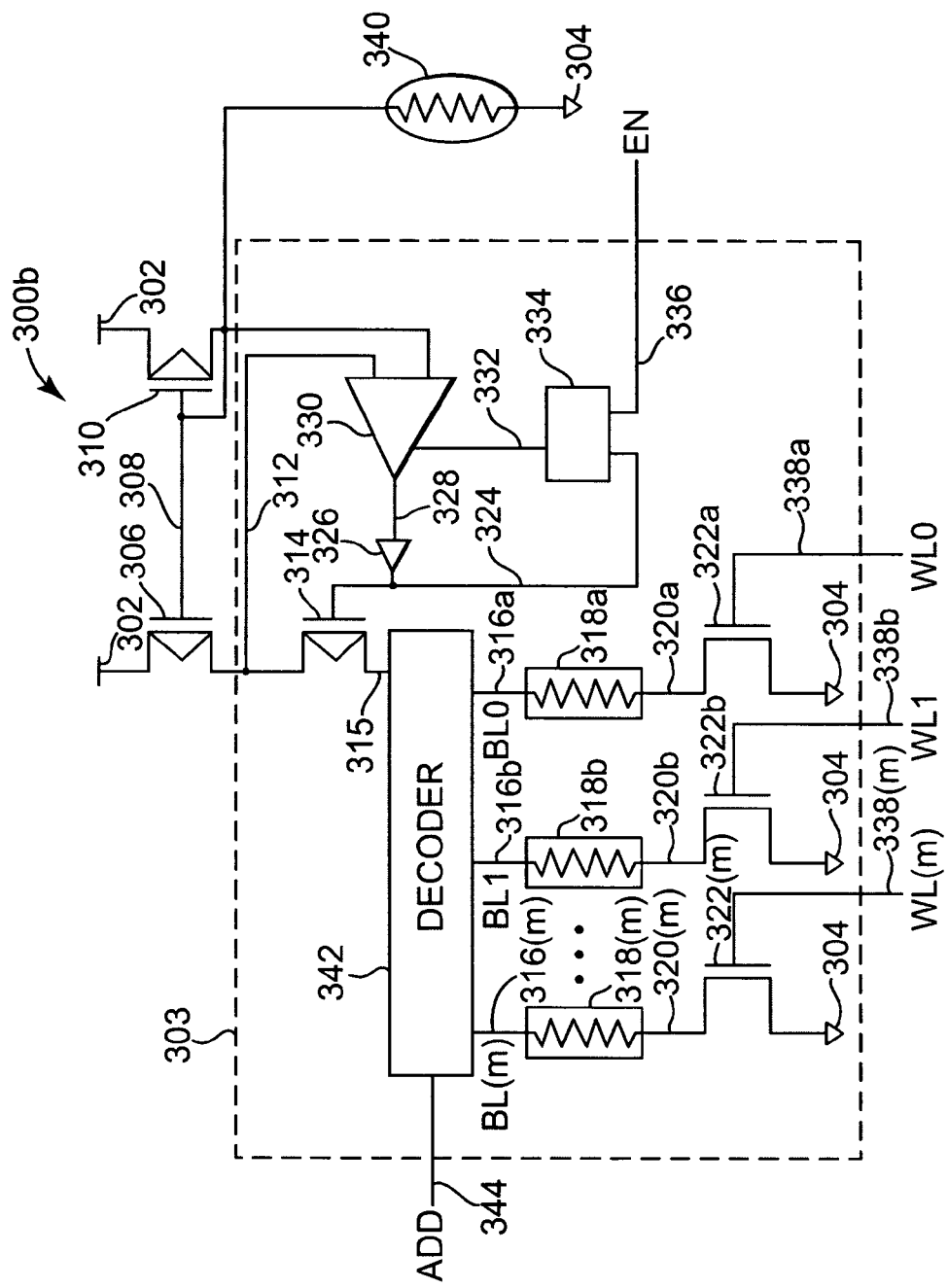
FIG. 3B is a diagram illustrating one embodiment of a circuit for programming phase-change memory cells.

FIG. 3B is a diagram illustrating one embodiment of a circuit 300b for programming phase-change memory cells. In one embodiment, circuit 300b includes a portion of write pulse generator 102 and distribution circuit 104 for programming phase-change memory cells into any one of the four states illustrated in FIG. 2. Circuit 300b includes a switching and memory cells circuit indicated at 303. Circuit 300b also includes current source 340 and the current mirror formed by transistors 306 and 310. Switching and memory cells circuit 303 includes transistor 314, buffer 326, sense amplifier 330, logic block 334, decoder 342, transistors 322a-322(m), and phase-change memory cells 318a-318(m), where "m" is any suitable number of phase-change memory cells, such as 16.

Switching and memory cells circuit 303 is similar to switching and memory cell circuit 301 except for the addition of decoder 242, multiple memory cells 318a-318(m), and transistors 322a-322(m). A first input of decoder 342 is electrically coupled to one side of the source-drain path of transistor 314 through signal path 315. A second input of decoder 342 receives an address (ADD) signal on ADD signal path 344. The outputs of decoder 342 are electrically coupled to one side of phase-change memory cell 318a-318(m) through bit line zero 316a—bit line (m) 316(m). The other sides of phase-change memory cells 318a-318(m) are electrically coupled to one side of the source-drain path of transistors 322a-322(m). The other sides of the source-drain paths of transistors 322a-322(m) are electrically coupled to common or ground 304. The gates of transistors 322a-322(m) receive the word line zero (WL0)—word line (m) (WL(m)) signals on word lines 338a-338(m).

Decoder 342 receives the address signal on ADD signal path 344 and electrically couples signal path 315 to one of bit lines 316a-316(m) based on the address signal. In response to an address signal indicating BL0, decoder 342 closes a switch to pass the signal on signal path 315 to BL0 316a and opens switches to block the signal on signal path 315 from passing to bit lines 316b-316(m). Likewise, in response to an address signal indicating BL(m), decoder 342 closes a switch to pass the signal on signal path 315 to BL(m) 316(m) and opens switches to block the signal on signal path 315 from passing to bit lines 316a-316(m-1). In another embodiment, decoder 342 is excluded and bit lines 316a-316(m) are electrically coupled directly to signal path 315.

With decoder 342 passing the signal on signal path 315 to a bit line 316a-316(m), switching and memory cells circuit 303 functions similarly to switching and memory cell circuit 301 previously described and illustrated with reference to FIG. 3A.

Figure 4:
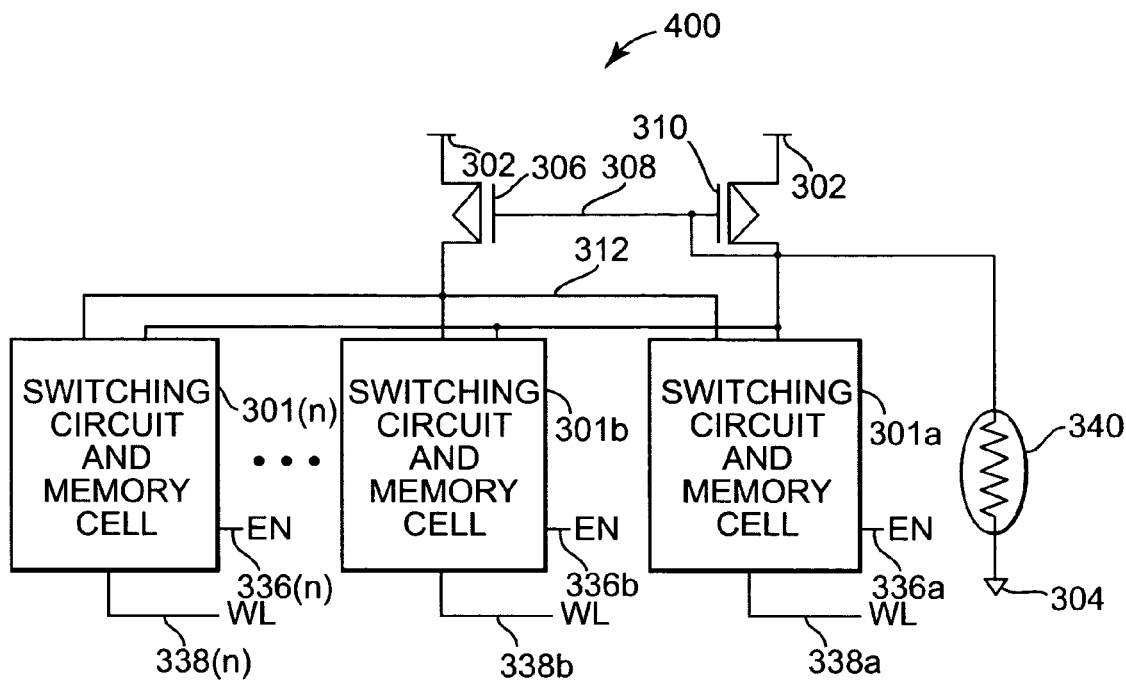
FIG. 4 is a diagram illustrating one embodiment of a circuit for programming several phase-change memory cells.

FIG. 4 is a diagram illustrating one embodiment of a circuit 400 for programming several phase-change memory cells. Circuit 400 is similar to circuit 300a except that circuit 400 includes several switching and memory cell circuits 301a-301(n), where "n" is any suitable number of switching and memory cell circuits, such as 16. Circuit 400 includes switching and memory cell circuits 301a-301(n). In another embodiment, switching and memory cell circuit 301 is replaced with switching and memory cells circuit 303.

Each switching and memory cell circuit 301a-301(n) receives an EN signal on EN signal paths 336a-336(n) and a WL signal on word lines 338a-338(n). Each switching and memory cell circuit is electrically coupled to the input of the current mirror through signal path 308 and the output of the current mirror through signal path 312. Each switching and memory cell circuit 301a-301(n) functions similarly to switching and memory cell circuit 301 previously described and illustrated with reference to FIG. 3A.

In this embodiment, multiple memory cells can be simultaneously programmed to a desired state based on the selected current provided by current source 340. Each phase-change memory cell is selected by providing a logic high WL signal on the corresponding word line 338a-338(n). The switching circuit is enabled for the selected phase-change memory cells by providing a logic high EN signal on the corresponding EN signal path 336a-336(n). The duration of the current pulse for each selected phase-change memory cell is independent of the other phase-change memory cells. Each selected phase-change memory cell receives a current pulse until that phase-change memory cell is set to the desired resistance level or state.

Figure 5:
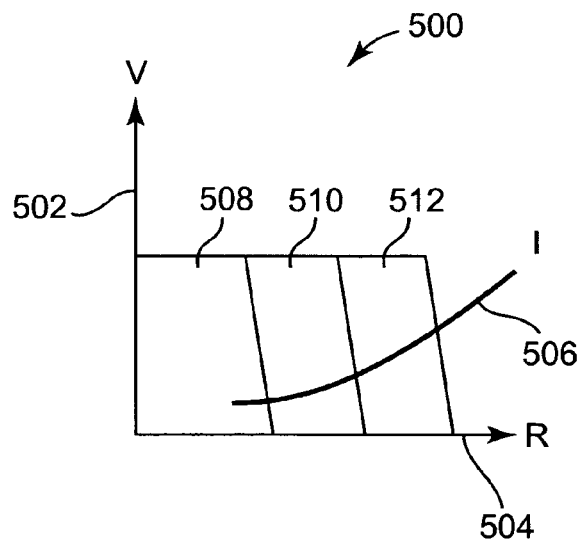
FIG. 5 is a graph illustrating one embodiment of sense amplifier output versus resistance of a phase-change memory cell.

FIG. 5 is a graph illustrating one embodiment of sense amplifier 330 output versus resistance of phase-change memory cell 318. Graph 500 includes the voltage output of sense amplifier 330 on Y-axis 502 and the resistance of phase-change memory cell 318 on X-axis 504. Based on the selected current 506 from current source 340 and the resistance of phase-change memory cell 318, the voltage output of sense amplifier 330 varies. Current 506 can be selected to set phase-change memory cell 318 to one of multiple possible resistance levels or states, such as the states indicated at 508, 510, and 512.

Embodiments of the invention provide a self-terminating write circuit for setting the state of a phase-change memory cell based on a reference value. A current pulse from the output of a current mirror is applied to the phase-change memory cell. Once the phase-change memory cell reaches the desired state, the current pulse is removed automatically by the write circuit. Therefore, multilevel writing of the phase-change material of the memory cell is fast, consistent, and precise. In addition, the write circuit features a self-controlled power down mode for conserving power after setting the phase-change memory cell.

What is claimed is:

1. An integrated circuit having a memory comprising:
   a first resistive memory cell;
   a current source configured to provide an input current indicating a first resistance level for the first memory cell;
   a current mirror that mirrors the input current to provide an output current; and
   a first switching circuit comprising a comparator configured to compare an input voltage of the current mirror and an output voltage of the current mirror to provide a control signal, the first switching circuit configured to pass the output current to the first memory cell with the first memory cell not at the first resistance level, and block the output current from the first memory cell in response to the control signal indicating the first memory cell achieving the first resistance level.

2. The integrated circuit of claim 1, wherein the current source comprises a variable current source.

3. The integrated circuit of claim 1, wherein the first switching circuit comprises:
   a switch configured to selectively pass the output current to the first memory cell based on the control signal.

4. The integrated circuit of claim 1, further comprising:
   a second resistive memory cell; and
   a second switching circuit configured to pass the output current to the second memory cell with the second memory cell not at the first resistance level, and block the output current from the second memory cell in response to the second memory cell achieving the first resistance level.

5. The integrated circuit of claim 4, wherein the first switching circuit and the second switching circuit are configured to simultaneously set the resistance level of the first memory cell and the second memory cell.

6. The integrated circuit of claim 1, further comprising:
   a second resistive memory cell,
   wherein the first switching circuit is configured to pass the output current to the second memory cell with the second memory cell not at the first resistance level, and block the output current from the second memory cell in response to the second memory cell achieving the first resistance level.

7. A memory comprising:
   a phase-change memory cell;
   a switch coupled to the memory cell;
   a variable current source configured to provide a current indicating a desired resistance level for the memory cell;
   a current mirror having an input coupled to the current source and an output coupled to the switch; and
   a sense amplifier having a first input coupled to the input of the current mirror and a second input coupled to the output of the current mirror, the sense amplifier configured to compare a voltage at the input of the current mirror to a voltage at the output of the current minor and control the switch based on the comparison to set the memory cell to the desired resistance level.

8. The memory of claim 7, wherein the switch comprises a transistor switch.

9. The memory of claim 7, further comprising:
   a logic block having an output coupled to an enable input of the sense amplifier, the logic block configured to disable the sense amplifier based on the comparison.

10. The memory of claim 7, wherein the memory cell is configured to be set to each one of at least three resistance levels.

11. The memory of claim 7, wherein the memory cell comprises at least one of Ge, Sb, Te, Ga, As, In, Se, and S.

12. A memory comprising:
    a phase-change memory cell configured to be set to each one of at least three states;
    means for enabling a set pulse to the memory cell through a current mirror;
    means for comparing a voltage at the output of the current mirror indicating an actual state of the memory cell to a voltage at the input of the current mirror indicating a desired state for the memory cell; and
    means for disabling the set pulse in response to the comparison with the memory cell set to the desired state.

13. The memory of claim 12, further comprising:
    means for disabling the means for comparing in response to the comparison.

14. The memory of claim 12, wherein the memory cell comprises at least one of Ge, Sb, Te, Ga, As, In, Se, and S.

15. A method for setting the state of a memory cell, the method comprising:

mirroring an input current at an input to a current mirror to provide an output current at an output of the current mirror;

applying the output current to a resistive memory cell;

comparing a voltage at the input of the current mirror indicating a desired state of the memory cell to a voltage at the output of the current mirror indicating an actual state of the memory cell; and removing the output current from the memory cell based on the comparison with the memory cell at the desired state.

16. The method of claim 15, wherein applying the output current comprises applying the output current to modify the actual state of the memory cell from a first state having a first resistance to a second state having a second resistance less than the first resistance.

17. The method of claim 15, wherein removing the output current comprises removing the output current in response to the voltage at the output of the current mirror being less than or equal to the voltage at the input of the current mirror.

18. The method of claim 15, further comprising:
disabling the comparing based on the comparison.

19. The method of claim 15, wherein applying the output current comprises applying the output current to a phase-change memory cell configured for multi-bit data storage.

20. A method for writing to a memory, the method comprising:

resetting a phase-change memory cell to a substantially amorphous state;

mirroring an input current at an input of a current mirror to provide an output current at an output of the current mirror;

enabling a set pulse to the memory cell by passing the output current to the memory cell;

comparing a voltage at the output of the current mirror indicating an actual state of the memory cell to a voltage at the input of the current mirror indicating a desired state out of at least three states for the memory cell; and disabling the set pulse to the memory cell in response to the voltage at the output of the current mirror being less than or equal to the voltage at the input of the current mirror by blocking the output current from passing to the memory cell.

21. The method of claim 20, further comprising:
providing the input current from a variable current source, the input current indicating the desired state for the memory cell.

22. The method of claim 20, further comprising:
disabling the comparing in response to disabling the set pulse.

23. The method of claim 20, wherein enabling the set pulse comprises enabling the set pulse to change the actual state of the memory cell from a first state having a first resistance to a second state having a second resistance less than the first resistance.

24. A memory comprising:
a phase-change memory cell; and
a self-terminating write driver configured to write a selected one of at least three resistance levels to the memory cell by providing a current pulse to the memory cell, the current pulse provided by selectively passing a constant current to the memory cell from an output of a current mirror;

wherein an input of the current mirror receives a constant current indicating the selected one of the at least three resistance levels; and wherein a duration of the current pulse is based on feedback from the memory cell indicating an actual resistance level of the memory cell.

* * * * *